(12) United States Patent
Gebauer et al.

(10) Patent No.: US 6,815,613 B2
(45) Date of Patent: Nov. 9, 2004

(54) ELECTRONIC COMPONENT WITH EXTERNAL CONNECTION ELEMENTS

(75) Inventors: Uta Gebauer, München (DE); Volker Strutz, Tegernheim (DE)

(73) Assignee: Technologies AG, Munich (DE)

( * ) Notice: Subject to any disclaimer, the term of this patent is extended or adjusted under 35 U.S.C. 154(b) by 0 days.

(21) Appl. No.: 09/951,823

(22) Filed: Sep. 13, 2001

(65) Prior Publication Data

US 2002/0053467 A1 May 9, 2002

(30) Foreign Application Priority Data

Sep. 13, 2000 (DE) .......................................... 100 45 534

(51) Int. Cl.[7] .............................. H02G 3/08; H05K 5/00
(52) U.S. Cl. ................................ 174/52.1; 228/180.21; 257/780
(58) Field of Search ................................ 257/780, 737; 174/260, 52.4, 52.1; 228/180.21

(56) References Cited

U.S. PATENT DOCUMENTS

| 5,476,211 A | * 12/1995 | Khandros | ................. 228/180.5 |
| 5,925,927 A | 7/1999 | Orcutt | |
| 6,215,670 B1 | 4/2001 | Khandros | .................... 361/774 |

2002/0100977 A1 * 8/2002 Kimura ....................... 257/738

FOREIGN PATENT DOCUMENTS

| DE | 197 04 930 A1 | 9/1997 |
| DE | 199 07 427 A1 | 9/1999 |
| JP | 61 117 857 A | 6/1986 |
| JP | 09320660 A | 12/1997 |
| JP | 09321419 A | 12/1997 |
| JP | 11186465 A | 7/1999 |

OTHER PUBLICATIONS

Glenn Rinne: "Spheres, springs, columns and beams", Advanced Packaging, Jul. 2001, pp. 67–70.

* cited by examiner

*Primary Examiner*—Hung V. Ngo
(74) *Attorney, Agent, or Firm*—Laurence A. Greenberg; Werner H. Stemer; Ralph E. Locher

(57) ABSTRACT

The invention relates to an electronic component with external connection elements and to a method of electrically connecting and/or fixing an electronic component to a printed-circuit board. For this purpose, the electronic component has capillary elements as external connection elements, which are connected to contact connection areas of a leadframe or to contact areas of a chip. The capillary element protrudes out of the electronic component and has, on its protruding end, a suction opening with capillary action.

29 Claims, 3 Drawing Sheets

ELECTRONIC COMPONENT WITH EXTERNAL CONNECTION ELEMENTS

BACKGROUND OF THE INVENTION

Field of the Invention

The present invention relates to an electronic component with external connection elements and to a method of electrically connecting and/or fixing the electronic component and a printed-circuit board.

To make the most optimum possible use of the surface area of printed-circuit boards, they are provided with components on both sides. The fixing and electrical connecting of electronic components on both sides of the printed-circuit board surface, performed for example by soldering, in many cases requires additional adhesive fixing points between the component and the printed-circuit board, in particular for the components which are to be electrically bonded on the underside of the printed-circuit board, since otherwise there is the risk of these components falling off.

SUMMARY OF THE INVENTION

The object of the invention is to specify an electronic component with external connection elements with which additional fixing points on the components become superfluous and which ensures adhesive bonding of the component when it is being connected to a printed-circuit board, so that a printed-circuit board can be provided with components on both sides without the components on the underside of the printed-circuit board falling off during the connecting operation.

According to the invention, the electronic-component has external contact elements which are connected to contact connection areas of a leadframe or to contact connection areas of a chip. In this case, at least one external connection element is designed as a capillary element which protrudes out of the component and has at its protruding end a suction opening with capillary action. This solution has the advantage that, by means of the suction opening with capillary action of its capillary element, the electronic component significantly increases the adhesion in a liquid drop of solder which is adhering to the printed-circuit board, in comparison with external connection elements with no capillary action. The increased adhesion of the component in relation to a printed-circuit board brought about by means of capillary action has the effect that the component is secured against falling off the underside of a printed-circuit board provided with components on both sides. What is more, on account of the external connection elements according to the invention in the form of capillary elements, a solid extensive material bridge can develop between the component and the printed-circuit board in the form of a solder column, so that it is possible to dispense with additional fixing points, for example of epoxy adhesive.

The elements on the electronic component which bring about the capillary effect may be created already during component production. In addition, this electronic component has the advantage that, when it is being connected to the printed-circuit board, additional mechanical protection of the component contacts against damage due to compression or shearing is formed by the development of a solid-extensive material bridge such as a solder column. Finally, the use of only one material, that is for example a solder, for connecting and fixing the electronic component on a printed-circuit board, dispensing with adhesive fixing points, greatly simplifies the exchange of electronic components on printed-circuit boards, since no other additional fixing materials have to be removed and replaced for the exchange to be carried out.

Consequently, the external connection elements of the electronic component according to the invention allow the distance between the component and the printed-circuit board to be bridged by capillary action and allow extensive contacts which greatly increase the adhesion between the component and the printed-circuit board to develop. In addition, a possible way of mechanically stabilizing sensitive contacts is created, needing no additional materials or processes and consequently being entirely suitable for production. All that is required for this purpose is that the electronic component according to the invention has capillary elements as external connection elements.

In an embodiment of the invention, the suction opening with capillary action of the external connection elements is formed as a capillary slit. A capillary slit of this type can be made in any previously known external contact element without great effort, preferably by slitting the external connection element in its longitudinal direction. This provides the possibility of achieving additional adhesion by the capillary action of the longitudinal slit when the electronic component is being connected to the printed-circuit board.

In a further embodiment of the invention, the suction opening with capillary action may be formed as a ring. This variant is advantageous if the electronic component has pins as external connection elements, it being possible for these pins to be replaced by longitudinally slit hollow pins to form the annular suction opening with capillary action, thereby achieving an additional capillary action which can hold the component in position, even underneath a printed-circuit board, on account of the increased adhesion.

A further embodiment provides that the capillary element has a multiple arrangement of vertical contact elements which form a capillary gap. Vertical contact elements of this type may be produced, for example, by simple folding of conventional flat external connection elements. Such contact elements have an increased capillary action on account of the large-area capillary gap and are therefore suitable for large-volume electronic components.

A further embodiment of the invention provides that the capillary element has twin bumps, which are arranged at a distance from each other with capillary action. Twin bumps of this type may be arranged directly on the contact areas of a chip, so that this embodiment is particularly suitable for semiconductor chips which are to be arranged directly on a printed-circuit board.

A further embodiment of the invention provides a multi-layer printed-circuit board to be connected to the electrical component, with conductor tracks of a copper alloy. The surfaces of multi-layer printed-circuit boards of this type are provided with electronic components on both sides, use of the electronic component according to the invention preventing the components which are to be arranged on the underside from falling off.

With a further embodiment of the invention, the adhesion is increased by the capillary elements having a surface coating to enhance the wetting properties with respect to molten solder. A surface coating of this type has in one embodiment a nickel-gold alloy.

In one embodiment of the invention, the suction opening with capillary action has an opening width of between 50 $\mu$m and 500 $\mu$m. This opening width depends substantially on the wetting properties of the surface of the capillary element with respect to a liquid solder. The better the wetting properties, the larger the opening width may be, so that a larger material bridge develops between the printed-circuit board and the component.

In a further embodiment of the invention, a slit with capillary action is provided for a slit width of 50 μm to 500 μm. It must also be taken into account in respect of the slit width that, the better the wetting properties of the surface of the capillary element become, the larger the slit width can be.

In a further embodiment of the invention, it is provided that the vertical contact elements have in relation to the component surface an inclination at an angle α. On account of this inclination, the flexibility of the contact elements with respect to a 90° arrangement is increased and the loading of the component according to the invention is reduced. What is more, the adhesive action at the same distance between the electronic component according to the invention and the printed-circuit board is increased on account of the inclination of the contact elements in relation to the component surface, since the wetting area is enlarged.

In a further embodiment of the invention, the electronic component according to the invention is anchored by means of a solder bridge between the capillary element and a printed-circuit board on the printed-circuit board and electrically connected to it. The adhesiveness of this solder bridge is already developed when the solder is melted, as a result of which the electronic component adheres to the printed-circuit board without additional fixing points being required.

A further embodiment provides that the electronic component is a semiconductor chip with twin bumps. The twin bumps already mentioned above can be produced at relatively low cost on a semiconductor chip, since all that is necessary is to provide for each previously existing bump on the semiconductor chip a further contact area on which a further-or second bump of the twin bumps is formed. The distance between the twin bumps must be chosen to be small enough for a capillary action to occur in the gap between the two twin bumps.

A further embodiment of the invention provides that the electronic component has a plastic housing, from which the multiply arranged vertical contact elements protrude. This embodiment has the advantage that the contact elements can be embedded securely and correctly in the plastic housing and there is no risk of displacement of the contact elements in relation to one another.

In a further embodiment of the invention, the electronic component has in its housing a leadframe which bears vertical contact elements and has at least one semiconductor chip with an integrated circuit. An electronic component of this type has the advantage that the leadframe provides significantly more surface area for fastening the vertical contact elements on the electronic component than there is directly on a semiconductor chip. The transition from the semiconductor chip to the leadframe and from the leadframe to the capillary elements as external connections contacts can be realized in an advantageous way by process techniques conforming to the semiconductor process.

In a further embodiment of the invention, the printed-circuit board has soldering areas with soldering material which protrudes into the capillary elements of the electronic component. This soldering material additionally reinforces the external connection elements and at the same time protects them against damage due to shearing or compression.

A method of electrically connecting and/or fixing an electronic component and a printed-circuit board has the following method steps:

providing the electronic component with at least one capillary element, which has an opening with capillary action and protrudes out of the component, selectively coating a printed-circuit board with a wetting material on predetermined contact connection areas, heating the wetting material to its melting temperature, positioning and aligning electronic components on the upper side and underside of the printed-circuit board, immersing the capillary elements in the molten material, forming an extensive contact with the capillary element and on the printed-circuit board while simultaneously solidifying the material.

This method has the advantage that the adhesion of the electronic component on the printed-circuit board in the region of the molten material is significantly increased by the capillary action of the capillary element, so that there is no longer any need for additional steps such as applying adhesive to adhesively bond the components on the underside of the printed-circuit board. What is more, the connections between the printed-circuit board and the external connection elements of the electronic component are additionally reinforced by the material column developing in the capillary element, so that protection against damage due to shearing or due to compression can develop. Consequently, a great mechanical stabilization can be achieved, in particular for sensitive contacts. At the same time, additional processes and materials, serving merely for fixing the components on the underside of a printed-circuit board, are eliminated. In addition, a repair process is simplified in that, when replacing an electronic component according to the invention, all that is necessary is for a single material component to be fused on, and no further steps relating to additional fixing points comprising adhesives are required.

A further method step provides that the surface of the capillary element is coated with a layer promoting the wetting. A layer of this type may be applied by means of a vapor-depositing technique or sputtering technique, the vapor-depositing technique having the advantage of lower expenditure on apparatus, while the sputtering technique has the advantage that materials not capable of being vapor-deposited can be applied to the surfaces of the capillary elements in the form of layers.

In a further example of how the method can be implemented, the wetting-promoting layer is applied by means of currentless metal deposition from a solvent. Although in the case of such a method the electronic component must be immersed with its external connection elements into a solvent, the expenditure on apparatus for a coating of this type is much less than in the case of the previous method.

In addition, there is the possibility of applying the wetting-promoting layer by means of electroplating, a current having to flow between a metallic sacrifice anode and the capillary elements connected to the cathode. In this case, the application of an electric voltage to the capillary elements may be problematical, for which reason such a step must be carried out before the capillary elements are attached to the electronic component.

A further example of how the method can be implemented provides that the opening with capillary action is produced by multiple folding of a flat external connection element. All that is required for this purpose is an extended external connection element, which can be produced by folding in a meandering shape, while ensuring a distance with capillary action between the folds. In an advantageous way, this does not significantly increase the expenditure previously required for producing electronic components. It is just necessary for the design of a metallic leadframe with flat conductors to be made to match the multiple folding of the external connection elements by providing longer flat conductors as external connection elements.

In a further example of implementation, an opening with capillary action can be produced in a flat external connection element by means of punching out longitudinal slits. Although this does not achieve the increase in surface area of multiple folding, such longitudinal slitting of a flat external connection element can already increase the adhesion with respect to the soldering material of the printed-circuit board based on the capillary action of the slits, without having to alter the outside dimensions of flat external connection elements.

In a further example of how to implement the method, the capillary element is produced in the form of a hollow pin with a longitudinal slit by rotary swaging of a flat external connection element. This rotary swaging of an initially flat external connection element may be performed for example by rotary swaging over a mandrel and consequently requires only small additional expenditure for the production of the capillary element.

In order to produce a virtually rectangular or oval cross section of an opening with capillary action, a round longitudinally slit capillary element may be flattened, so that a rectangular or oval cross section is automatically obtained.

In order in this way to make optimum use of the surface area of the printed-circuit boards and provide components on both sides of them, the components on the underside of the printed-circuit board must be protected against falling off, for example by the adhesion of the contact pads or the external connection elements of an electronic component or by additional fixing points.

The adhesion of an electronic component with respect to a printed-circuit board is determined in this case by the total surface area of these connections. The required addition may be restricted, however, by the relation of the distance of the electronic component from the surface of the printed-circuit board, the freely available surface area and the type and material of the connection process.

If the contact pads and/or fixing points are shaped according to the invention in such a way that capillary action can cause a solid extensive material bridge to develop between the component and the printed-circuit board, for example by a solder column forming, dimensional restrictions as well as material- and process-related restrictions can be overcome.

According to the invention, the elements bringing about the capillary effect are already produced during the processes necessary for producing the component or printed-circuit board. An advantage of these solid-extensive material bridges, which are made possible by the electronic component according to the invention, is additional mechanical protection of the component contacts against damage due to shearing or compression after the soldering has been carried out. Finally, component fixing comprising only one material such as a soldering material greatly simplifies printed-circuit board repair, since no additional other fixing material has to be removed and re-applied after the repair.

Consequently, the present invention has the advantage that the capillary action contributes to bridging the distance between the component and the printed-circuit board and that extensive contacts are formed, significantly increasing the adhesion between the component and the printed-circuit board. What is more, additional processes and material components such as adhesives can be eliminated. Furthermore, mechanically very sensitive contacts are greatly stabilized.

The present invention has the result that fixing and stabilizing technologies used when providing printed-circuit boards with components are superseded by a low-cost variant needing no additional materials and processes, and in which processes suitable for production, such as for example solder-paste printing, can be integrated, and the repair process can be realized in a simple way.

Embodiments of the invention are now explained in more detail with reference to figures.

DESCRIPTION OF THE PREFERRED EMBODIMENTS

Figure 1:
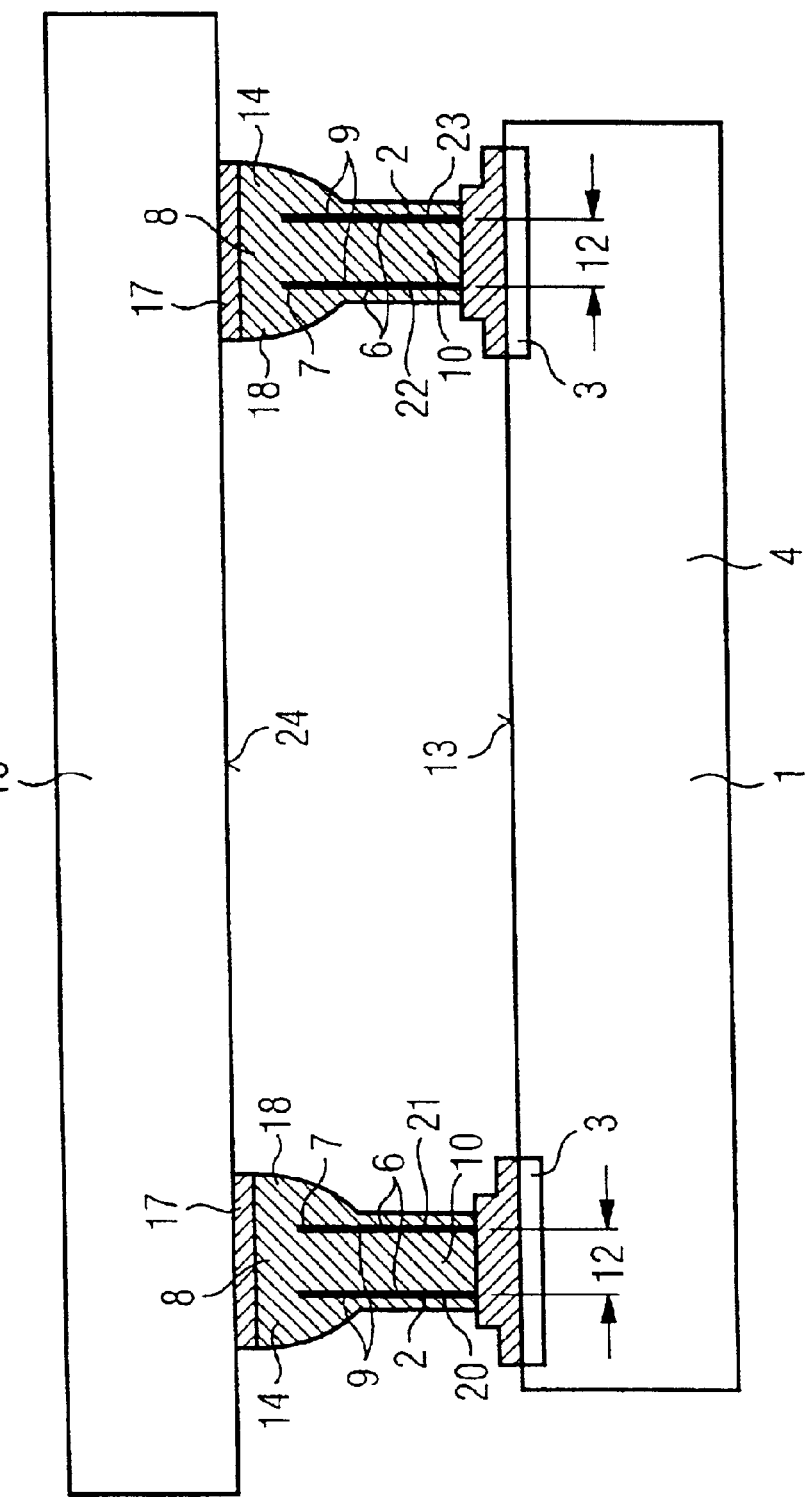
FIG. 1 shows a basic diagram of a first embodiment of the invention.

FIG. 1 shows a basic diagram of a first embodiment of the invention. In FIG. 1, the reference numeral 1 designates an electronic component, the reference numeral 2 designates an external connection element, the reference numeral 3 designates a contact connection area of a leadframe, the reference numeral 4 designates a leadframe, the reference numeral 6 designates capillary elements, the reference numeral 7 designates protruding ends of the capillary elements and the reference numeral 8 designates suction openings with capillary action. With the reference numeral 9, vertical contact elements are designated, with the reference numeral 10 a capillary gap is designated, with the reference numeral 12 a distance with capillary action is designated, with reference numeral 13 the component surface is designated and with reference numeral 14 a solder bridge is designated. Shown in FIG. 1 in addition to the electronic component 1 is a printed-circuit board 15 with soldering areas 17, on which a soldering material 18 is arranged.

In this embodiment of the invention according to FIG. 1, the electronic component 1 has external connection elements 2, which symbolize vertical contact elements. On the other hand, it is also possible to achieve such external connection elements 2 by a U-shaped folding of a flat external connection element 2. According to FIG. 1, each external connection element has two legs 20, 21 and 22, 23, between which a distance 12 with capillary action is arranged.

Along with two flat external connection elements 2, FIG. 1 symbolizes the cross section through a hollow pin, which may have a rectangular, oval or round cross section (not shown).

The external connection element 2 with capillary action, referred to hereafter as capillary element 6, has at its protruding end a suction opening 8 with capillary action. If an opening of this type is immersed into a solder drop which is hanging vertically down, the component remains suspended from the solder drop on account of the capillary action of the capillary element and can only be freed from the suspended position by overcoming the capillary force and the adhesive force.

Consequently, the first embodiment of the invention already shows the positive effect which can be achieved by a component designed according to the invention. This effect consists in that components according to the invention can be arranged on the underside 24 of a printed-circuit board 15 without falling off the underside 24 of the printed-circuit board. For this purpose, the soldering material 18 is melted on the soldering area 17 of the printed-circuit board 15 and the electronic component according to the invention is immersed by the opening with capillary action of its capillary elements into the liquid soldering material and is held in the suspended position on the underside 24 of the printed-circuit board 15, as shown in FIG. 1, on account of the capillary force.

Accordingly, the printed-circuit board 15 can be provided with components on both sides without the risk of the components suspended underneath falling off. For this purpose, the distance 12 with capillary action must be made to match the soldering material and the wetting properties of the surface of the capillary element 6.

Once the soldering material has solidified, a further advantage of the electronic component according to the invention becomes evident, that is that the electrical contact is both mechanically reinforced and electrically improved, since the external connection elements of limited cross section no longer determine the mechanical strength and electrical resistance; instead, the solder column produced by the capillary action both reduces the electrical resistance and increases the mechanical strength. Consequently, the external connection elements are protected against shearing off or being damaged by compression.

Figure 2:
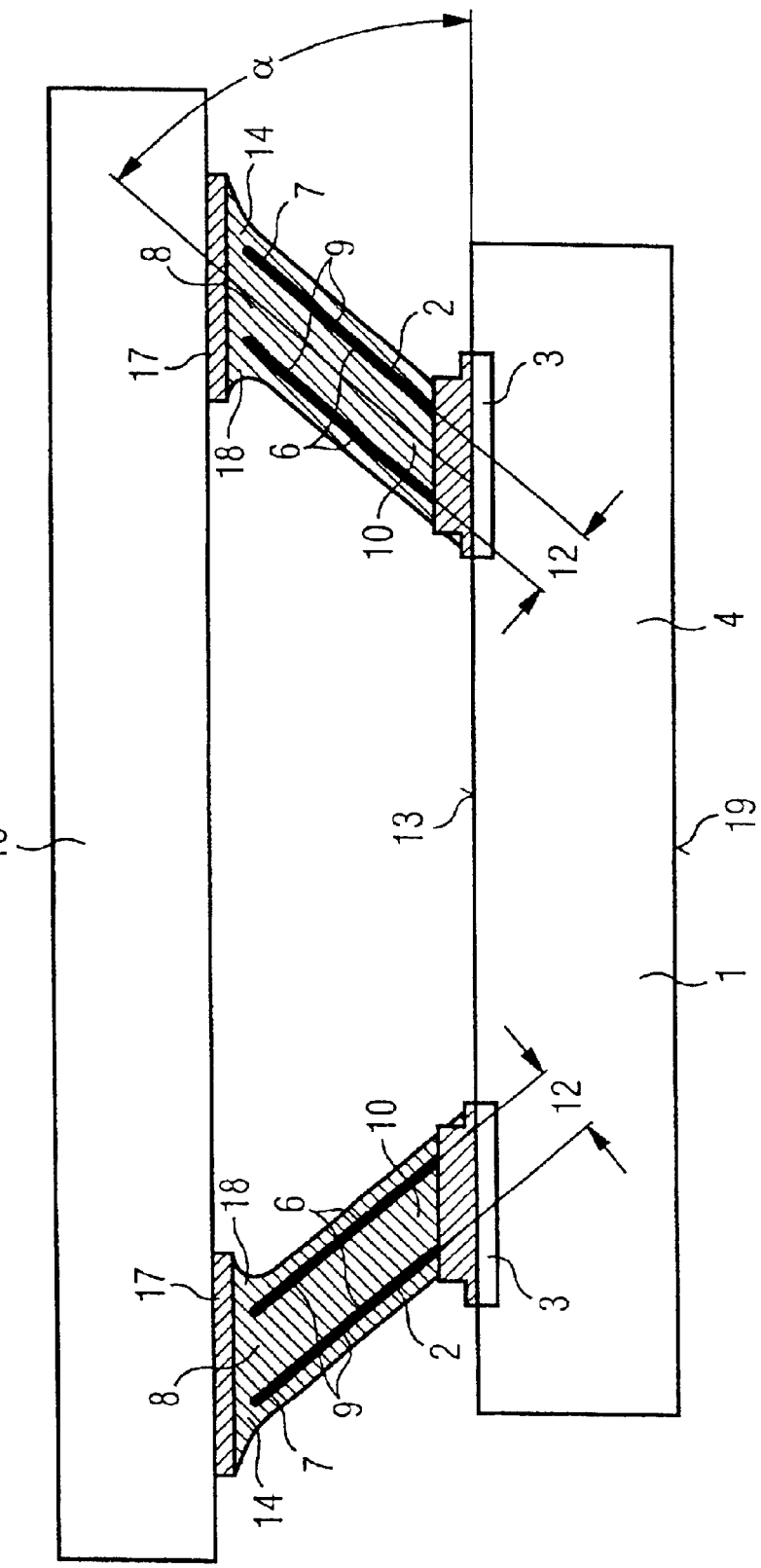
FIG. 2 shows a basic diagram of a second embodiment of the invention.

FIG. 2 shows a second embodiment of the invention.

Components in FIG. 2 which perform the same functions as in FIG. 1 are provided with the same reference numerals, so that there is no need for an explanation. Shown in FIG. 2 is an electronic component with a plastic housing 19, which has capillary elements 6 comprising vertical contact elements 9.

The capillary action is enhanced in this embodiment by the inclination of the external connection elements by the angle α in relation to the component surface 13. Consequently, with the same distance between a printed-circuit board 15 and the electronic component 1, the surface area with capillary action in the capillary element is enlarged. Such an enlargement can be appropriately used if the total weight of the electronic component 1 becomes greater. In addition, the embodiment according to FIG. 2 shows in comparison with the embodiment according to FIG. 1 the advantage that the inclination of the external connection elements has the effect of reducing the loading of the electronic component 1 as it approaches the printed-circuit board 15, since the inclined external connection elements can yield elastically.

Figure 3:
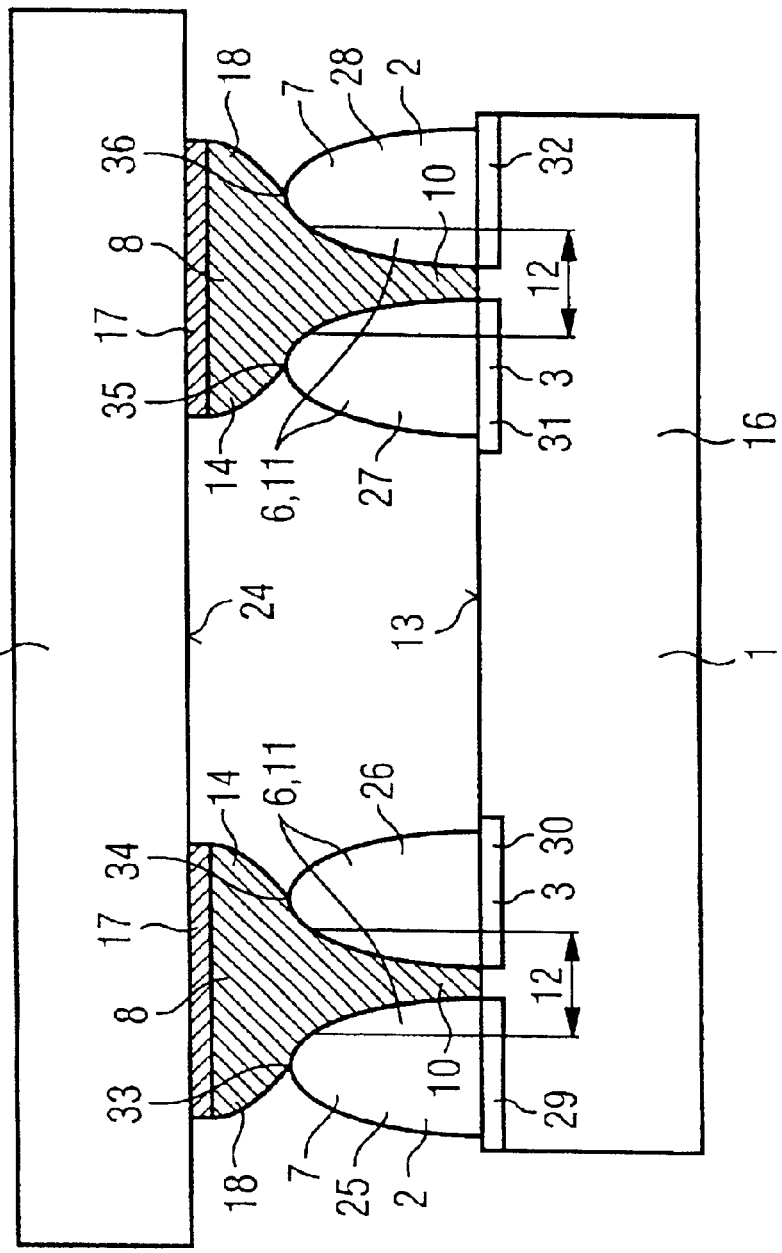
FIG. 3 shows a basic diagram of a third embodiment of the invention.

FIG. 3 shows a third embodiment of the invention. Components in FIG. 3 which perform the same functions as in FIG. 1 or 2 are provided with the same reference numerals, so that there is no need for any explanation. The external connection elements 2 in this embodiment are contact bumps 25, 26, 27, 28. The contact bumps 25, 26, 27, 28 are arranged in pairs to form twin bumps 11. Bumps of this type can be formed directly on a semiconductor chip 16. To represent twin bumps, all that is necessary is for two bumps to be arranged at a distance 12 with capillary action on corresponding contact areas 29, 30, 31, 32 of a chip. As soon as the tips 33, 34, 35, 36 of the contact bumps 25, 26, 27, 28 touch the molten soldering material 18 on the soldering areas 17 on the underside 24 of the printed-circuit board 15, the capillary force of the distance with capillary action between the twin bumps 11 becomes effective and holds the semiconductor chip 16 in a suspended position on the underside 24 of the printed-circuit board 15. This embodiment of the invention is used wherever a semiconductor chip is arranged directly with its contact bumps on the underside 24 of a printed-circuit board 15 when providing components on both sides of the printed-circuit board 15.

| List of designations | |
|---|---|
| 1 | electronic component |
| 2 | external connection elements |
| 3 | contact connection area |
| 4 | leadframe |
| 5 | chip |
| 6 | capillary element |
| 7 | protruding end of the capillary element |
| 8 | suction opening |
| 9 | vertical contact elements, two or more arranged close together |
| 10 | capillary gap |
| 11 | twin bumps |
| 12 | distance with capillary action |
| 13 | component surface |
| 14 | solder bridge |
| 15 | printed-circuit board |
| 16 | semiconductor chip |
| 17 | soldering areas |
| 18 | soldering material |
| 19 | housing |
| 20, 21, 22, 23 | legs |
| 24 | underside |
| 25, 26, 27, 28 | contact bumps |
| 29, 30, 31, 32 | contact areas of a chip |
| 33, 34, 35, 36 | tips of the contact bumps |

We claim:

1. An electronic component, comprising:

a component selected from a group consisting of a leadframe having contact connection areas and a chip having contact areas;

external connection elements connected to regions selected from a group consisting of said contact connection areas of said leadframe and said contact areas of said chip;

at least one of said external connection elements being designed as a capillary element having an externally protruding end formed with a suction opening exhibiting capillary action.

2. The electronic component according to claim 1, wherein:

said suction opening is formed as a capillary slit.

3. The electronic component according to claim 1, wherein:

said suction opening is formed as a ring.

4. The electronic component according to claim 1, wherein:

said capillary element has a hollow longitudinally slit contact pin.

5. The electronic component according to claim 1, wherein:

said capillary element has a longitudinally slit flat contact pin.

6. The electronic component according to claim 1, wherein:

said capillary element has at least two vertically arranged contact elements.

7. The electronic component according to claim 6, wherein:
said component, selected from the group consisting of said leadframe and said chip, has a surface; and
said contact elements are inclined at an angle relative to said surface.

8. The electronic component according to claim 1, comprising:
a plastic housing;
said capillary element protruding from said housing.

9. The electronic component according to claim 8, wherein:
said component is selected to be said leadframe;
said leadframe has at least one semiconductor chip with an integrated circuit;
said leadframe bears against said capillary element; and
said leadframe is housed by said housing.

10. The electronic component according to claim 1, wherein:
said capillary element has twin bumps configured at a distance from each other; and
said bumps exhibit capillary action.

11. The electronic component according to claim 10, wherein:
said component is selected to be said chip; and
said bumps are arranged directly on said contact areas of said chip.

12. The electronic component according to claim 10, comprising:
a semiconductor chip formed with said bumps.

13. The electronic component according to claim 1, in combination with a printed-circuit board, the electronic component comprising:
a solder bridge attaching said capillary element and said printed-circuit board.

14. The combination according to claim 13, wherein:
said solder bridge is electrically connected to said printed circuit board.

15. The combination according to claim 14, wherein:
said printed-circuit board is a multi-layer printed-circuit board having two sides provided with components and conductor tracks of a copper alloy.

16. The electronic component according to claim 1, wherein:
said capillary element has wetting properties and a surface coating to enhance the wetting properties with respect to a molten solder.

17. The electronic component according to claim 1, wherein: said capillary element is coated with a nickel-gold alloy.

18. The electronic component according to claim 1, wherein:
said suction opening has an opening width of between 50 µm and 500 µm.

19. The electronic component according to claim 1, wherein:
said suction opening is formed as a capillary slit; and
said slit has a slit width of between 50 µm and 500 µm.

20. A method for performing a function selected from a group consisting of electrically connecting an electronic component and a printed-circuit board and fixing the electronic component to the printed-circuit board, the method which comprises:
providing the electronic component with at least one protruding capillary element formed with a suction opening exhibiting capillary action;
selectively coating predetermined areas of the printed-circuit board with a wetting material having a melting temperature;
heating the wetting material to the melting temperature to obtain a molten material;
positioning and aligning at least one electronic component on an underside of the printed-circuit board while immersing the capillary element in the molten material; and
forming an extensive contact in the capillary element and on the printed-circuit board while simultaneously solidifying the molten material.

21. The method according to claim 20, which comprises:
coating surfaces of the capillary element with a wetting-promoting layer.

22. The method according to claim 21, which comprises:
using a vapor-depositing technique to apply the wetting-promoting layer.

23. The method according to claim 21, which comprises:
using a sputtering technique to apply the wetting-promoting layer.

24. The method according to claim 21, which comprises:
applying the wetting-promoting layer by a currentless metal deposition from a solvent.

25. The method according to claim 21, which comprises:
applying the wetting-promoting layer by electroplating.

26. The method according to claim 20, which comprises:
producing the suction opening by multiply folding a flat external connection element.

27. The method according to claim 20, which comprises:
producing the suction opening by punching out longitudinal slits in a flat external connection element.

28. The method according to claim 20, which comprises:
producing the capillary element as a hollow pin with a longitudinal slit by rotary swaging a flat external connection element.

29. The method according to claim 20, which comprises:
providing the capillary element as a round longitudinally slit capillary element;
by flattening the round longitudinally slit capillary element and by compressing a round pin, providing the suction opening with an oval to a rectangular cross section.

* * * * *